(12) United States Patent
Lee et al.

(10) Patent No.: US 11,404,102 B2
(45) Date of Patent: Aug. 2, 2022

(54) SEMICONDUCTOR DEVICE, SEMICONDUCTOR SYSTEM, AND METHOD OF OPERATING THE SEMICONDUCTOR DEVICE

(71) Applicant: SAMSUNG ELECTRONICS CO., LTD., Suwon-si (KR)

(72) Inventors: Soo Min Lee, Hwaseong-si (KR); Ki Hwan Seong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 16/707,278

(22) Filed: Dec. 9, 2019

(65) Prior Publication Data

US 2020/0388320 A1   Dec. 10, 2020

(30) Foreign Application Priority Data

Jun. 5, 2019 (KR) .......................... 10-2019-0066673

(51) Int. Cl.
*G11C 11/4076* (2006.01)
*G06F 1/06* (2006.01)
*G11C 11/4093* (2006.01)

(52) U.S. Cl.
CPC .......... *G11C 11/4076* (2013.01); *G06F 1/06* (2013.01); *G11C 11/4093* (2013.01)

(58) Field of Classification Search
CPC .................................... G06F 1/10; G06F 1/12
See application file for complete search history.

(56) References Cited

U.S. PATENT DOCUMENTS

| | | | | |
|---|---|---|---|---|
| 5,101,203 A | * | 3/1992 | Gersbach | H03M 9/00 377/80 |
| 7,030,931 B2 | * | 4/2006 | Eckhardt | H04N 21/4305 348/E5.122 |
| 7,649,910 B1 | * | 1/2010 | Wechsler | H04L 12/422 370/518 |
| 7,755,402 B1 | | 7/2010 | Ku et al. | |
| 8,428,207 B1 | | 4/2013 | Dally et al. | |
| 8,497,707 B2 | | 7/2013 | Liu et al. | |

(Continued)

FOREIGN PATENT DOCUMENTS

WO   WO 2010/080172 A1   7/2010

OTHER PUBLICATIONS

Extended European Search Report dated Sep. 18, 2020 for copending application EP 20163854.1.

*Primary Examiner* — Phil K Nguyen
(74) *Attorney, Agent, or Firm* — Lee IP Law, PC

(57) ABSTRACT

A semiconductor device includes a gate signal generator to receive a first clock signal and to generate a first gate signal and a second gate signal based on the first clock signal; a gating clock signal generator to receive a second clock signal and to generate a first gating clock signal, a second gating clock signal and a third gating clock signal based on the first and second gate signals from the gate signal generator and the second clock signal; a data sampler to receive a third clock signal from the gating clock signal generator and to sample an input serial data signal based on the third clock signal; and a deserializer to generate a parallel data signal by deserializing the input serial data signal based on at least one of the first, second, and third gating clock signals from the gating clock signal generator.

20 Claims, 15 Drawing Sheets

(56) References Cited

U.S. PATENT DOCUMENTS

| | | | |
|---|---|---|---|
| 9,184,909 B1 | 11/2015 | McCracken et al. | |
| 9,620,194 B1* | 4/2017 | Lee | G11C 11/406 |
| 9,639,495 B2 | 5/2017 | Dearth et al. | |
| 9,658,643 B2 | 5/2017 | Jeong et al. | |
| 2005/0018799 A1* | 1/2005 | Boerstler | H04L 7/0012 |
| | | | 375/360 |
| 2005/0172181 A1* | 8/2005 | Huliehel | G01R 31/3171 |
| | | | 714/724 |
| 2007/0043991 A1* | 2/2007 | Nguyen | H03M 9/00 |
| | | | 714/731 |
| 2007/0047680 A1* | 3/2007 | Okamura | H04L 1/24 |
| | | | 375/348 |
| 2008/0246626 A1* | 10/2008 | Sheafor | H04L 12/40032 |
| | | | 375/257 |
| 2015/0185758 A1* | 7/2015 | Jung | G06F 1/12 |
| | | | 713/502 |
| 2016/0116936 A1* | 4/2016 | Jeong | G06F 1/08 |
| | | | 713/503 |
| 2016/0285624 A1 | 9/2016 | Wagh et al. | |
| 2016/0306383 A1* | 10/2016 | Harriman | G06F 1/10 |
| 2018/0152284 A1 | 5/2018 | Hossain et al. | |

\* cited by examiner

SEMICONDUCTOR DEVICE, SEMICONDUCTOR SYSTEM, AND METHOD OF OPERATING THE SEMICONDUCTOR DEVICE

CROSS-REFERENCE TO RELATED APPLICATION

Korean Patent Application No. 10-2019-0066673, filed on Jun. 5, 2019, in the Korean Intellectual Property Office, and entitled: "Semiconductor Device, Semiconductor System, and Method of Operating the Semiconductor Device," is incorporated by reference herein in its entirety.

BACKGROUND

1. Field

Embodiments relate to a semiconductor device, a semiconductor system, and a method of operating the semiconductor device.

2. Description of the Related Art

A graphics double data rate (GDDR) memory, e.g., a graphics double data rate dynamic random access memory (GDDR DRAM) is a memory designed for graphic processing units (GPUs). A GDDR memory system may include a physical layer (PHY) circuit, e.g., a GDDR PHY circuit. The PHY circuit may include a physical layer interface for data transmission between, e.g., a GDDR memory and a GPU.

When reading data from a GDDR DRAM, a GDDR PHY circuit may not receive a clock signal related to a read operation from the GDDR DRAM. Thus, the GDDR PHY circuit may require to sample data received from the GDDR DRAM by itself.

SUMMARY

Embodiments are directed to a semiconductor device. The semiconductor device may include a gate signal generator to receive a first clock signal and to generate a first gate signal and a second gate signal based on the first clock signal; a gating clock signal generator to receive a second clock signal and to generate a first gating clock signal, a second gating clock signal and a third gating clock signal based on the first and second gate signals from the gate signal generator and the second clock signal; a data sampler to receive a third clock signal from the gating clock signal generator and to sample an input serial data signal based on the third clock signal; and a deserializer to generate a parallel data signal by deserializing the input serial data signal based on at least one of the first, second, and third gating clock signals from the gating clock signal generator.

Embodiments are directed to a semiconductor system. The semiconductor system may include a graphics double data rate dynamic random access memory (GDDR DRAM); and a PHY circuit including a first PHY circuit to receive an input serial data signal from the GDDR DRAM, a second PHY circuit to transmit a command and an address to the GDDR DRAM, and a controller to control the first PHY circuit and the second PHY circuit. The first PHY circuit may include a gate signal generator to receives a first clock signal and to generate a first gate signal and a second gate signal based on the first clock signal; a gating clock signal generator to receive a second clock signal and to generate a first gating clock signal, a second gating clock signal and a third gating clock signal based on the first gate signal and the second gate signal received from the gate signal generator and the second clock signal; a data sampler to receive a third clock signal from the gating clock signal generator and to sample the input serial data signal using the third clock signal; and a deserializer to generate a parallel data signal by deserializing the input serial data signal based on at least one of the first gating clock signal, the second gating clock signal and the third gating clock signal received from the gating clock signal generator.

Embodiments are directed to a method of operating a semiconductor device. The method may include generating a first gate signal and a second gate signal based on a first clock signal; generating a first gating clock signal, a second gating clock signal and a third gating clock signal based on a second clock signal, the first gate signal and the second gate signal; sampling an input serial data signal based on a third clock signal; and generating a parallel data signal by deserializing the input serial data signal based on at least one of the first gating clock signal, the second gating clock signal and the third gating clock signal.

BRIEF DESCRIPTION OF THE DRAWINGS

Features will become apparent to those of skill in the art by describing in detail exemplary embodiments with reference to the attached drawings in which.

DETAILED DESCRIPTION

Various embodiments will now be described with reference to the attached drawings.

Figure 1:
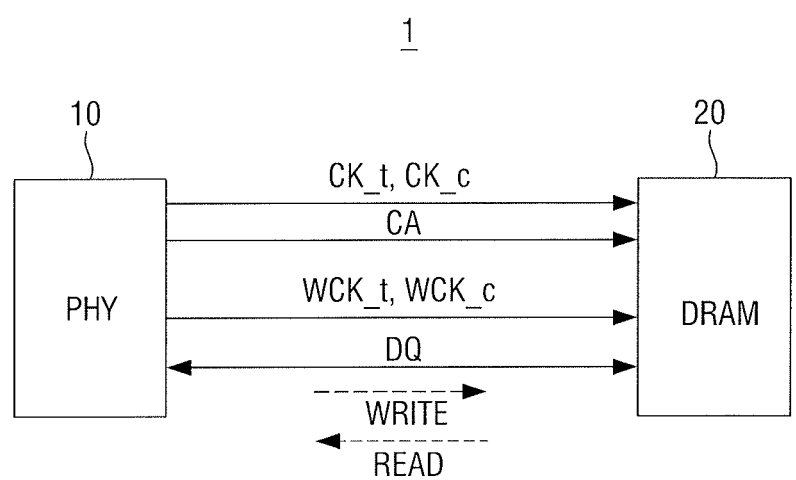
FIG. 1 illustrates a semiconductor system according to an example embodiment.

FIG. 1 illustrates a semiconductor system 1 according to an example embodiment. Referring to FIG. 1, the semiconductor system 1 may include a physical layer (PHY) circuit 10 and a graphics double data rate dynamic random access memory (GDDR DRAM) 20. The PHY circuit 10 may be a physical layer interface for data transmission with the GDDR DRAM 20. For example, the PHY circuit 10 may perform a write operation by writing data to the GDDR DRAM 20 or perform a read operation by reading data from the GDDR DRAM 20.

In the write operation of the semiconductor system 1, the PHY circuit 10 may transmit a command and an address CA to the GDDR DRAM 20. Further, the PHY circuit 10 may transmit data DQ to be written to the GDDR DRAM 20. Further, the PHY circuit 10 may transmit one or more clock signals CK_t and CK_c to the GDDR DRAM 20 with the command and the address CA. The PHY circuit 10 may also transmit one or more write clock signals WCK_t and WCK_c to the GDDR DRAM 20 with the data DQ. The clock signals CLK_t and CK_c and the write clock signals WCK_t and WCK_c may be predetermined for operations of the GDDR DRAM 20.

In the read operation of the semiconductor system 1, the PHY circuit 10 may transmit the command and the address CA to the GDDR DRAM 20 and receive the data DQ from the GDDR DRAM 20. For example, when the PHY circuit 10 reads data from the GDDR DRAM 20, the PHY circuit 10 may not receive a clock signal related to the read operation from the GDDR DRAM 20. Thus, the PHY circuit 10 may not receive information regarding an arriving time of the data DQ in the read operation of the semiconductor system 1. Therefore, the PHY circuit 10 may sample the data DQ based on its own clock signal, store the sampling result in a data structure, e.g., a first-in first-out (FIFO) structure, and restore the data DQ.

Figure 2:
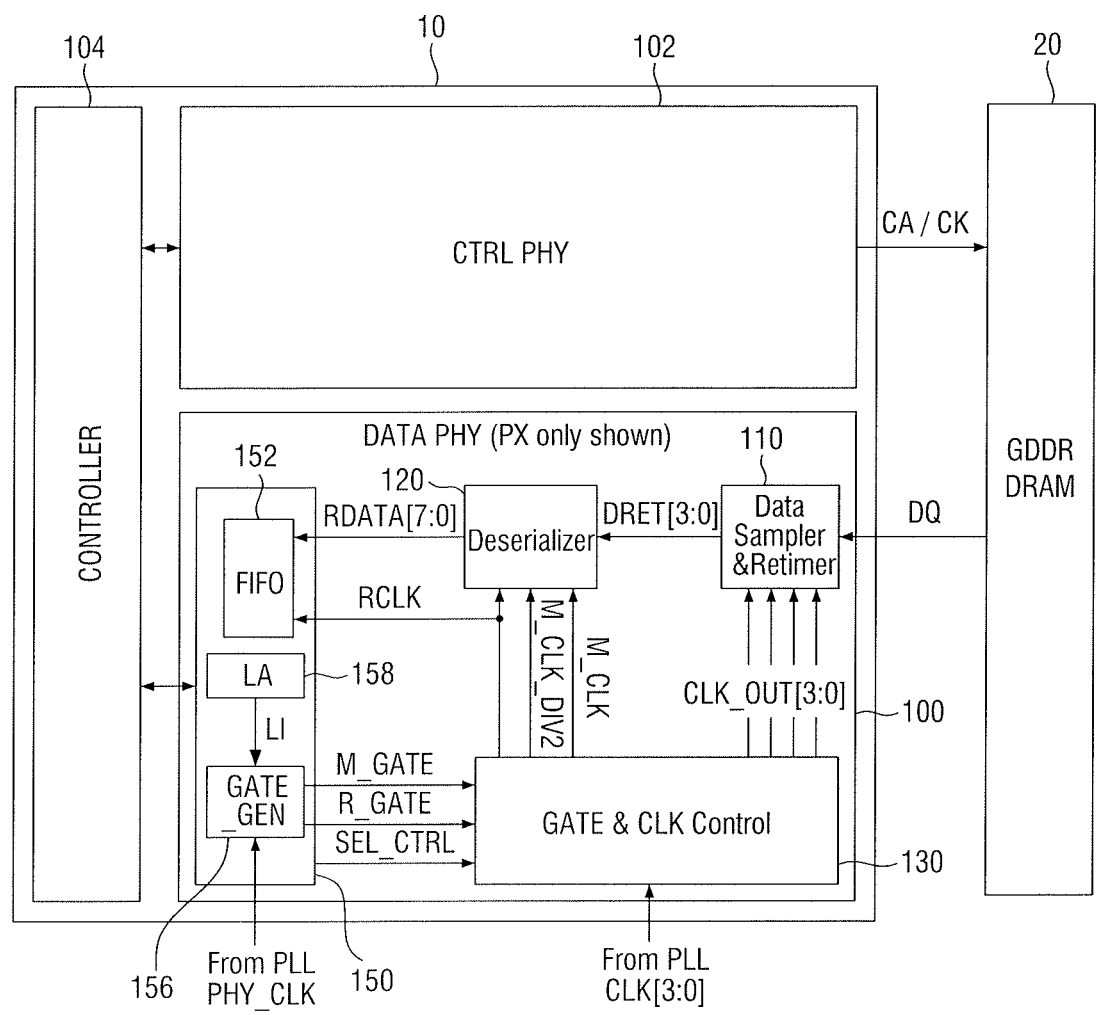
FIG. 2 illustrates a semiconductor system according to an example embodiment.

FIG. 2 illustrates a semiconductor system 2 according to an example embodiment. Referring to FIG. 2, a PHY circuit 10 of the semiconductor system 2 may include a first PHY circuit 100, a second PHY circuit 102, and a controller 104. For example, the first PHY circuit 100, the second PHY circuit 102, and the controller 104 of the PHY circuit 10 may be related to the read operation of the semiconductor system 2. Further, the PHY circuit in FIG. 2 may include additional elements related to other operations, e.g., the write operation, of the semiconductor system 2.

For example, the second PHY circuit 102 may transmit a command and an address CA to the GDDR DRAM 20. The controller 104 may control the first PHY circuit 100 and the second PHY circuit 102. The first PHY circuit 100 may receive an input data signal DQ from the GDDR DRAM 20 and sample the input data signal DQ based on its own clock signal. For example, the input data signal DQ may be serial data.

For example, the first PHY circuit 100 may include a data sampler 110, a deserializer 120, a gating clock signal generator 130, and a digital logic circuit 150. The digital logic circuit 150 may include a first-in-first-out (FIFO) structure 152, a FIFO structure control circuit 154, a gate signal generator 156, and a latency adjustment circuit 158.

According to an example embodiment, the PHY circuit 10 of the semiconductor system 2 may use the gating clock signal generator 130 and the gate signal generator 156 to effectively receive data from the GDDR DRAM 20. This will be described in detail below.

Figure 3:
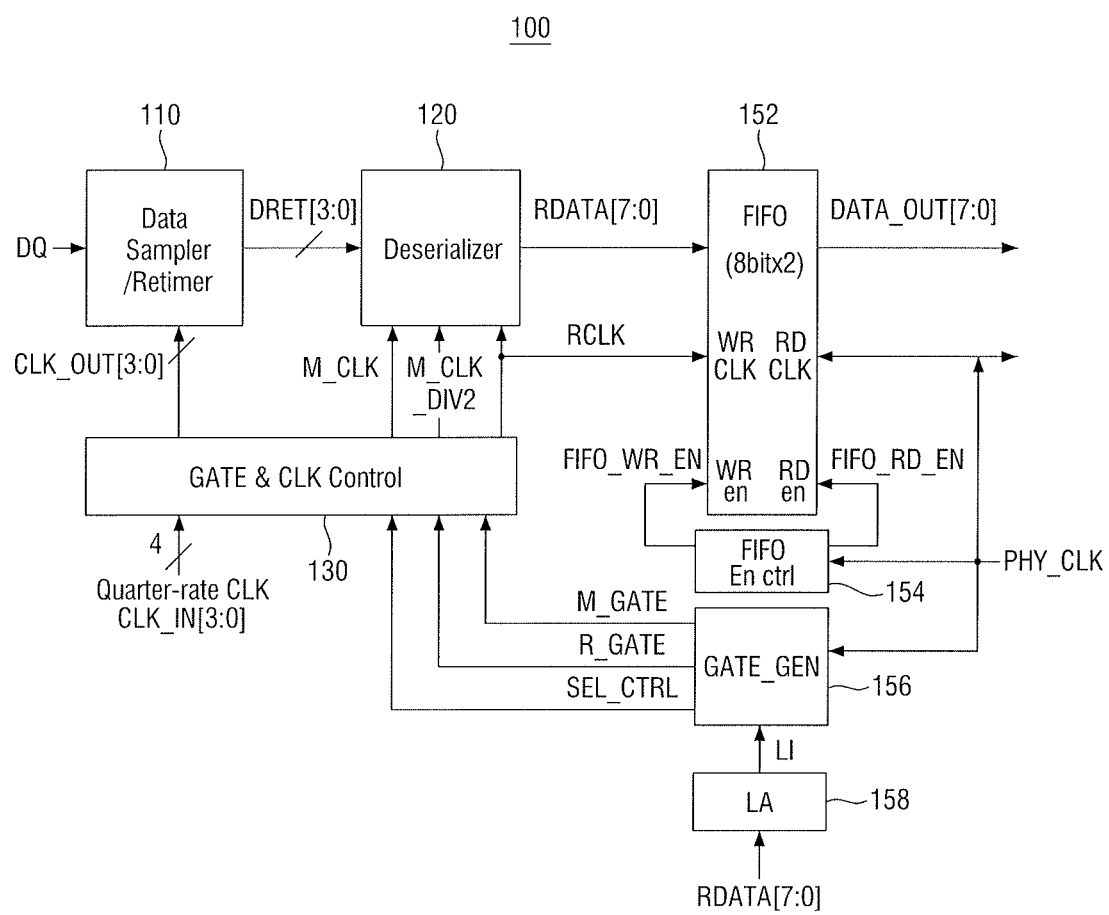
FIG. 3 illustrates a semiconductor device according to an example embodiment.
Figure 4:
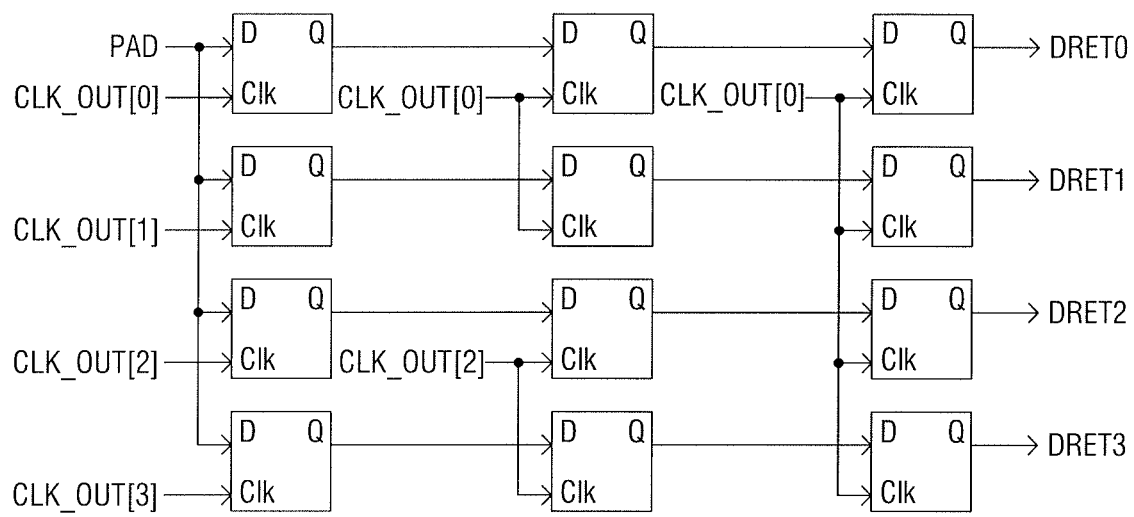
FIG. 4 illustrates a data sampler of the semiconductor device.
Figure 5:
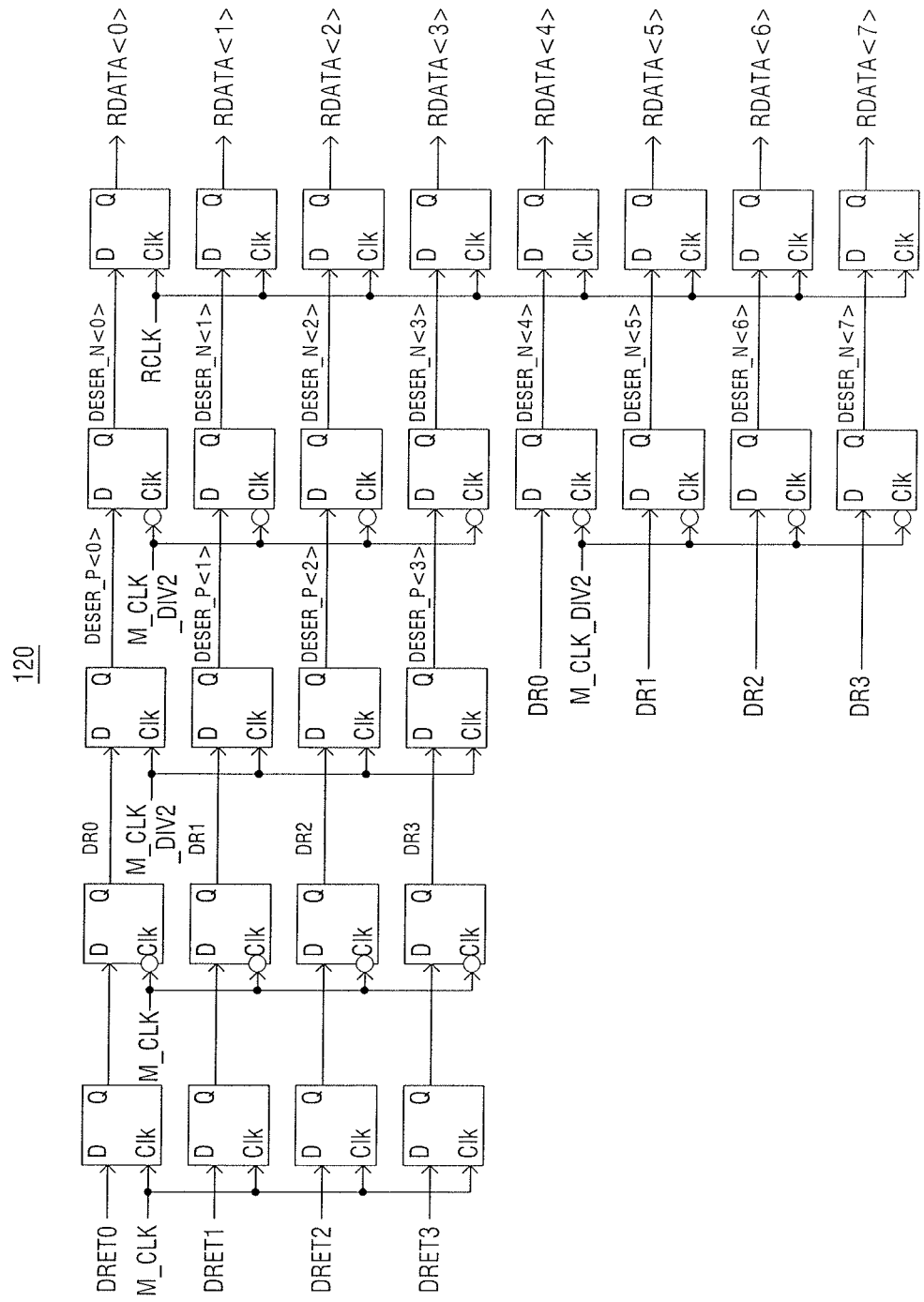
FIG. 5 illustrates a deserializer of the semiconductor device.

FIG. 3 illustrates a semiconductor device according to an example embodiment. For example, the semiconductor device may be the first PHY circuit 100 in FIG. 2. FIG. 4 illustrates the data sampler 110 of the semiconductor device, e.g., the PHY circuit 10, in FIG. 3 according to an example embodiment. FIG. 5 illustrates the deserializer 120 of the semiconductor device in FIG. 3 according to an example embodiment.

Referring to FIG. 3, the first PHY circuit 100 of the semiconductor device may include the data sampler 110, the deserializer 120, the gating clock signal generator 130, the FIFO structure 152, the FIFO structure control circuit 154, the gate signal generator 156, and the latency adjustment circuit 158.

The gate signal generator 156 may receive a first clock signal PHY_CLK and generate a first gate signal M_GATE and a second gate signal R_GATE. For example, the first gate signal M_GATE and the second gate signal R_GATE may be synchronized with the first clock signal PHY_CLK. For example, the first clock signal PHY_CLK may be transferred from a first phase-locked loop (PLL) circuit. The first gate signal M_GATE and the second gate signal R_GATE may be transferred from the gate signal generator 156 to the gate clock signal generation circuit 130. The first gate signal M_GATE and the second gate signal R_GATE may be used to generate a first gating clock signal M_CLK, a second gating clock signal M_CLK_DIV2 and a third gating clock signal RCLK.

The gating clock signal generator 130 may receive second clock signals CLK_IN[3:0] and generate the first gating clock signal M_CLK, the second gating clock signal M_CLK_DIV2 and the third gating clock signal RCLK based on the second clock signals CLK_IN[3:0] and the first gate signal M_GATE and the second gate signal R_GATE received from the gate signal generator 156. For example, the second clock signals CLK_IN[3:0] may be transferred from a second phase-locked loop (PLL) circuit to the gating clock signal generator 130.

According to an example embodiment, the first clock signal PHY_CLK and the second clock signals CLK_IN[3:0] may be asynchronous signals. For example, the first clock signal PHY_CLK and the second clock signals CLK_IN[3:0] may not be synchronized with each other. The first clock signal PHY_CLK may be generated by the first PLL circuit and have a first frequency. The second clock signals CLK_IN[3:0] may be generated by the second PLL circuit and have a second frequency different from the first frequency. Alternatively, the first clock signal PHY_CLK and the second clock signals CLK_IN[3:0] may be synchronized with each other.

According to an example embodiment, the first frequency of the second clock signals CLK_IN[3:0] may be predetermined so that the second clock signals CLK_IN[3:0] may be used to sample the input data signal DQ at a ¼ (quarter) rate. For example, the second clock signals CLK_IN[3:0] may be quarter-rate clocks, i.e., ¼-rate clocks. For example, each of the second clock signals CLK_IN[3:0] may be generated through ¼ phase shift from the adjacent clock signal. For example, the first frequency of each of the second clock signals CLK_IN[3:0] may be ¼ or less of a frequency of the input data signal DQ.

The first gating clock signal M_CLK, the second gating clock signal M_CLK_DIV2 and the third gating clock signal RCLK generated by the gating clock signal generator 130 may be transferred to the deserializer 120. For example, the third gating clock signal RCLK may be transferred to both the deserializer 120 and the FIFO structure 152.

The gating clock signal generator 130 may generate third clock signals CLK_OUT[3:0]. The third clock signals CLK_OUT[3:0] generated by the gating clock signal generator 130 may be transferred to the data sampler 110.

The gate signal generator 156 may further generate a selection signal SEL_CTRL. The gating clock signal generator 130 may select some of a plurality of internal signals of the gating clock signal generator 130 based on the selection signal SEL_CTRL received from the gate signal generator 156.

The data sampler 110 may receive the third clock signals CLK_OUT[3:0] from the gating clock signal generator 130 and sample the input data signal DQ based on the third clock signals CLK_OUT[3:0].

Referring to FIG. 4, the data sampler 110 may be implemented as a circuit including, e.g., a plurality of D flip-flops. The data sampler 110 may receive the input data signal DQ through an input terminal PAD. The input data signal DQ may be sampled through the D flip-flops that are respectively operated by the third clock signals CLK_OUT[3:0] and may have a ¼ speed rate, e.g., a ¼ frequency of the frequency of the input data signal DQ. The sampled input data signal DQ may be output as first intermediate sampling signals DRET[3:0]. The first intermediate sampling signals DRET[3:0] output from the data sampler 110 may be transferred to the deserializer 120. Further, the data sampler 110 in FIG. 4 may be an example and be implemented in various forms according to implementation purposes.

Referring to FIG. 3, the deserializer 120 may generate parallel data signals RDATA[7:0] by deserializing the first intermediate sampling signals DRET[3:0] based on at least one of the first gating clock signal M_CLK, the second gating clock signal M_CLK_DIV2 and the third gating clock signal RCLK received from the gating clock signal generator 130. For example, the deserializer 120 may convert the first intermediate sampling signals DRET[3:0] received from the data sampler 110 into the parallel data signals RDATA[7:0] that have a ⅛ speed rate, e.g., a ⅛ frequency of the frequency of the input data signal DQ.

Referring to FIG. 5, the deserializer 120 may be implemented as a circuit including, e.g., a plurality of D flip-flops. The deserializer 120 may convert the first intermediate sampling signals DRET[3:0] received from the data sampler 110 into the parallel data signals RDATA[7:0]. For example, the deserializer 120 may generate second intermediate sampling signals DR[3:0] based on the first intermediate sampling signals DRET[3:0]. Further, the second intermediate sampling signals DR[3:0] may be converted into third intermediate sampling signals DESER_P<0> through DESER_P<3> and fourth intermediate sampling signals DESER_N<0> through DESER_N<7>. Further, the fourth intermediate sampling signals DESER_N<0> through DESER_N<7> may be converted into the parallel data signals RDATA[7:0]. Further, the data sampler 110 in FIG. 4 and the deserializer 120 in FIG. 5 may be an example and be implemented in various forms according to implementation purposes.

Referring to FIG. 3, the FIFO structure 152 may be a data structure that stores the parallel data signals RDATA[7:0] according to the third gating clock signal RCLK received from the gating clock signal generator 130. The FIFO structure control circuit 154 may control the FIFO structure 152. Further, the FIFO structure control circuit 154 may transmit control signals, e.g., a FIFO write enable signal FIFO_WR_EN and a FIFO read enable signal FIFO_RD_EN, to the FIFO structure 152. The parallel data signals RDATA[7:0] stored in the FIFO structure 152 may be output as restored/recovered data DATA_OUT[7:0]. For example, the recovered data DATA_OUT[7:0] may be parallel data that are generated by deserializing the input data signal DQ as serial data Referring to FIG. 3, the latency adjustment circuit 158 may detect an optimal position by repeatedly shifting at least one of a gate signal and a clock signal by 1 unit interval (UI) until a predetermined data pattern is stored in the parallel data signals RDATA[7:0]. For example, the 1 UI may correspond to 1-bit time of the input data signal DQ. For example, the latency adjustment circuit 158 may repeatedly shift at least one of the gate signal and the clock signal by 1 UI until a 16-bit data pattern of the input data signal DQ is output to the parallel data signals RDATA[7:0].

Further, the latency adjustment circuit 158 may provide latency information LI for controlling the gate signal generator 156 to the gate signal generator 156. Based on the latency information LI, the gate signal generator 156 may repeatedly shift at least one of the gate signal and the clock signal by 0 UI, 1 UI, 2 UI or 3 UI based on the selection signal SEL_CTRL or may repeatedly shift at least one of the gate signal and the clock signal by 4 UI. For example, the gate signal generator 156 may repeatedly adjust at least one of the gate signal and the clock signal by 1 UI based on both of the above two methods, and a maximum adjustable range may vary according to implementation purposes.

Figure 6:
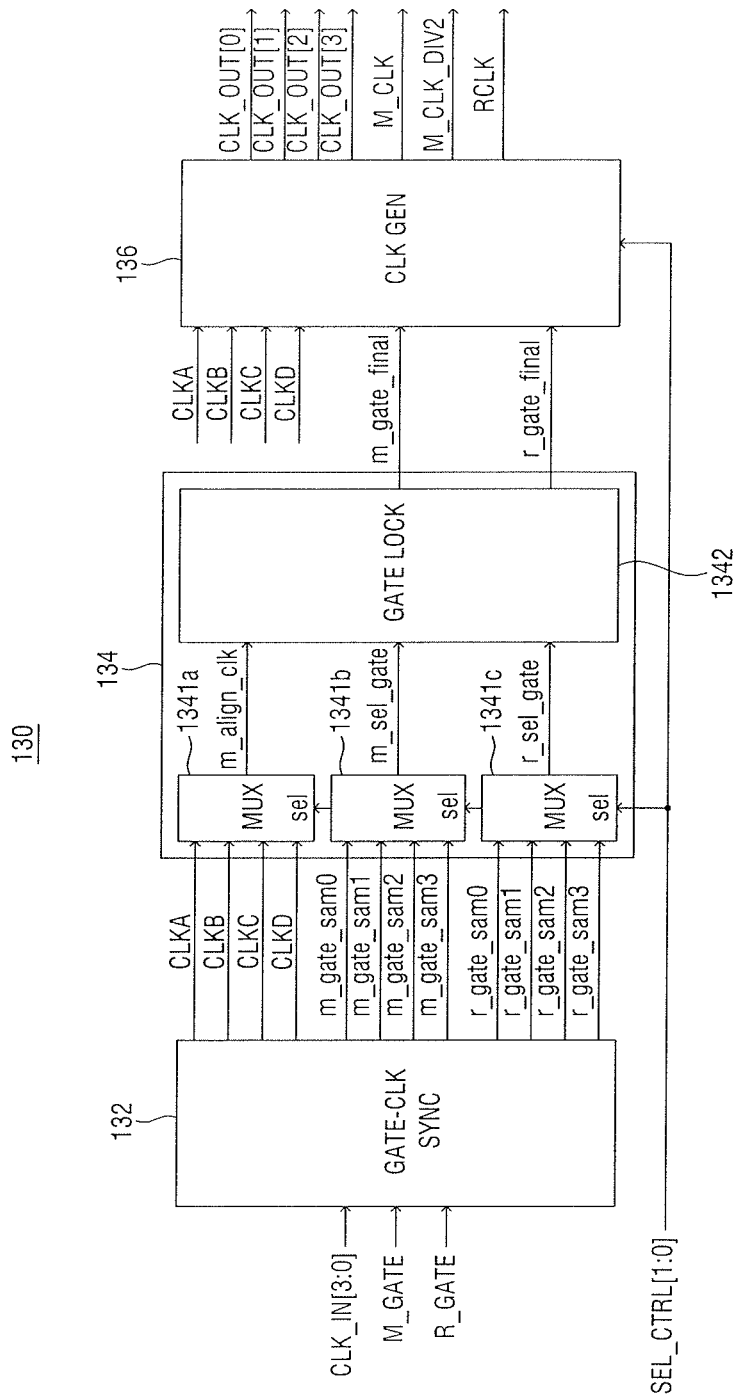
FIG. 6 illustrates a gating clock signal generator of the semiconductor device.

FIG. 6 illustrate the gating clock signal generator 130 of the semiconductor device, e.g., the PHY circuit 10, according to an example embodiment. Referring to FIG. 6, the gating clock signal generator 130 may include a gating clock synchronizer 132, a signal locker 134, and a clock generator 136.

The gating clock synchronizer 132 may generate a plurality of first sampling signals m_gate_sam0 through m_gate_sam3 and a plurality of second sampling signals r_gate_sam0 through r_gate_sam3 based on the first gate signal M_GATE and the second gate signal R_GATE.

For example, the gating clock synchronizer 132 may generate the first sampling signals m_gate_sam0 through m_gate_sam3 by sampling the first gate signal M_GATE based on the second clock signals CLK_IN[3:0]. Further, the gating clock synchronizer 132 may generate the second sampling signals r_gate_sam0 through r_gate_sam3 by sampling the second gate signal R_GATE based on the second clock signals CLK_IN[3:0].

The signal locker 134 may generate a first gate final signal m_gate_final and a second gate final signal r_gate_final by clock-aligning any one of the first sampling signals m_gate_sam0 through m_gate_sam3 and any one of the second sampling signals r_gate_sam0 through r_gate_sam3. For example, the first sampling signal m_gate_sam0 and the second sampling signal r_gate_sam0 may be aligned to each other.

For example, the signal locker 134 may clock-align any one of the first sampling signals m_gate_sam0 through m_gate_sam3 with fourth clock signals CLKA through CLKD derived from the second clock signals CLK_IN[3:0]. Further, the signal locker 134 may clock-align any one of the second sampling signals r_gate_sam0 through r_gate_sam3 with the fourth clock signals CLKA through CLKD derived from the second clock signals CLK_IN[3:0].

The clock generator 136 may generate the first gating clock signal M_CLK, the second gating clock signal M_CLK_DIV2 and the third gating clock signal RCLK based on the first gate final signal m_gate_final and the second gate final signal r_gate_final.

For example, the clock generator 136 may generate the first gating clock signal M_CLK, the second gating clock signal M_CLK_DIV2 and the third gating clock signal RCLK by clock-aligning the first gate final signal m_gate_final and the second gate final signal r_gate_final based on the fourth clock signals CLKA through CLKD. For example, the third gating clock signal RCLK may include only two toggle signals. Further, the clock generator 136 may generate the third clock signals CLK_OUT[3:0] based on the fourth clock signals CLKA through CLKD.

Figure 7:
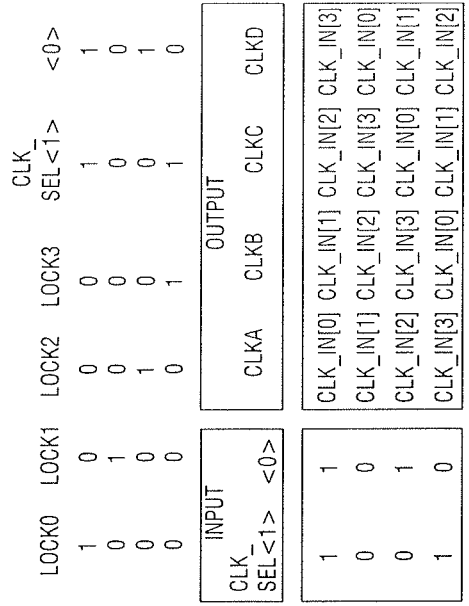
FIG. 7 illustrates an example of an operation of a gating clock synchronizer of the gating clock signal generator in FIG. 6.
Figure 7:
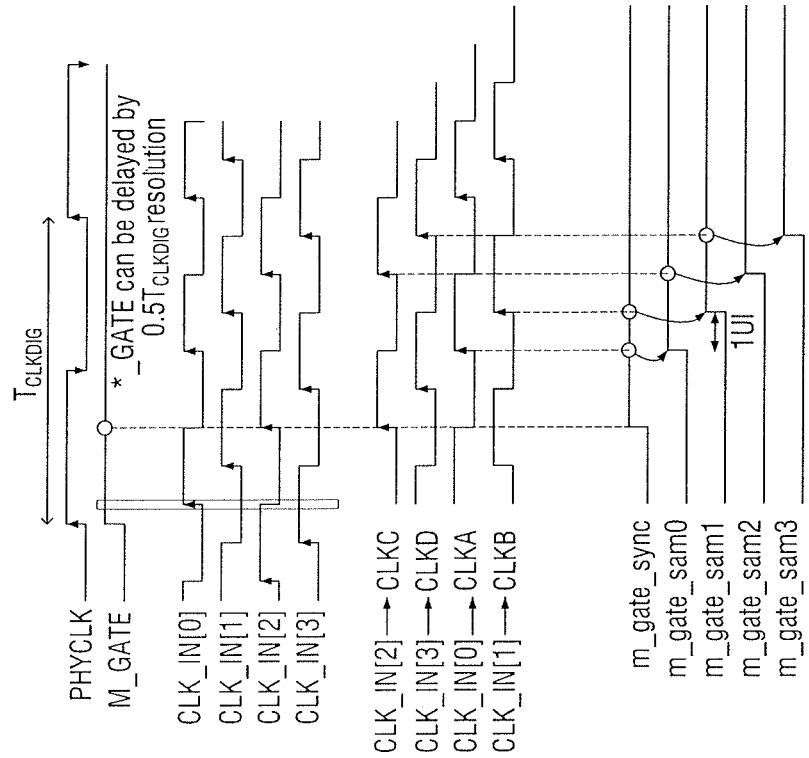

A method of operating a semiconductor device according to an example embodiment will now be described with reference to FIGS. 7 through 10. FIG. 7 illustrates an example for explaining the operation of the gating clock synchronizer 132 of the gating clock signal generator 130 in FIG. 6. Referring to FIG. 7, the gating clock synchronizer 132 may compare the second clock signals CLK_IN[3:0] and the first gate signal M_GATE to determine which one of the second clock signals CLK_IN[3:0] firstly samples a logic high of the first gate signal M_GATE. For example, a second clock signal CLK_IN[i] may be determined as the one of the second clock signals CLK_IN[3:0] that firstly samples the logic high of the first gate signal M_GATE, where "i" is one of indexes 0, 1, 2, and 3.

Referring to FIG. 7, for example, when the second clock signal CLK_IN[0] firstly samples the logic high of the first gate signal M_GATE, LOCK[0] may be set to 1, and LOCK[1], LOCK[2], and LOCK[3] may be set to 0. Alternatively, when the second clock signal CLK_IN[1] firstly samples the logic high of the first gate signal M_GATE, LOCK[1] may be set to 1, and LOCK[0], LOCK[2], and LOCK[3] may be set to 0. Further, when the second clock signal CLK_IN[2] firstly samples the logic high of the first gate signal M_GATE, LOCK[2] may be set to 1, and LOCK[0], LOCK[1], and LOCK[3] may be set to 0. Further, when the second clock signal CLK_IN[3] firstly samples the logic high of the first gate signal M_GATE, LOCK[3] may be set to 1, and LOCK[0], LOCK[1], and LOCK[2] may be set to 0.

Referring to FIG. 7, for example, when the second clock signal CLK firstly samples the logic high of the first gate signal M_GATE, the second clock signal CLK_IN[i+2] may be determined as a "CLKC" signal. For example, when the second clock signal CLK_IN[0] firstly samples the logic high of the first gate signal M_GATE, the second clock signal CLK_IN[2] may be determined as the "CLKC" signal. This is intended to secure a time margin because even though the second clock signal CLK_IN[0] firstly samples the logic high, a setup time or a hold time between the first gate signal M_GATE and the second clock signal CLK_IN[0] may not be sufficient. For example, the second clock signal CLK_IN[2] may be determined as the "CLKC" signal in order to secure the time margin. Alternatively, when the second clock signal CLK_IN[1] firstly samples the logic high of the first gate signal M_GATE, the second clock signal CLK_IN[3] may be determined as the "CLKC" signal.

The "CLKC" signal determined as described above may be used to stably sample the first gate signal M_GATE. Referring to FIG. 7, for example, the gating clock synchronizer 132 may generate a synchronization signal m_gate_sync by sampling the first gate signal M_GATE based on the "CLKC" signal. For example, the synchronization signal m_gate_sync may be a signal synchronized with the second clock signals CLK_IN[i], e.g., CLK_IN[2].

Further, the gating clock synchronizer 132 may generate four different first sampling signals m_gate_sam0 through m_gate_sam3 based on the synchronization signal m_gate_sync and the "CLKA," "CLKB," "CLKC" and "CLKD" signals. Each of the first sampling signals m_gate_sam0 through m_gate_sam3 may have a time offset of 1 UI.

For example, regarding the first gate signal M_GATE, the gating clock synchronizer 132 may compare the second clock signals CLK_IN[3:0] and the second gate signal R_GATE to determine which one of the second clock signals CLK_IN[3:0] firstly samples a logic high of the second gate signal R_GATE. For example, when the second clock signal CLK_IN[i] is determined as the one of the second clock signals CLK_IN[3:0] that firstly samples the logic high of the first gate signal M, the second clock signal CLK_IN[i+2] may be determined as a "CLKC" signal.

The "CLKC" signal determined as described above may be used to stably sample the second gate signal R_GATE. For example, the gating clock synchronizer 132 may generates a signal r_gate_sync by sampling the second gate signal R_GATE based on the "CLKC" signal. The signal r_gate_sync may be a signal synchronized with the second clock signals CLK_IN[3:0].

Further, the gating clock synchronizer 132 may generate four different second sampling signals r_gate_sam0 through r_gate_sam3 based on the signal r_gate_sync and the "CLKA," "CLKB," "CLKC" and "CLKD" signals. Each of second sampling signals r_gate_sam0 through r_gate_sam3 may have a time offset of 1 UI.

Figure 8:
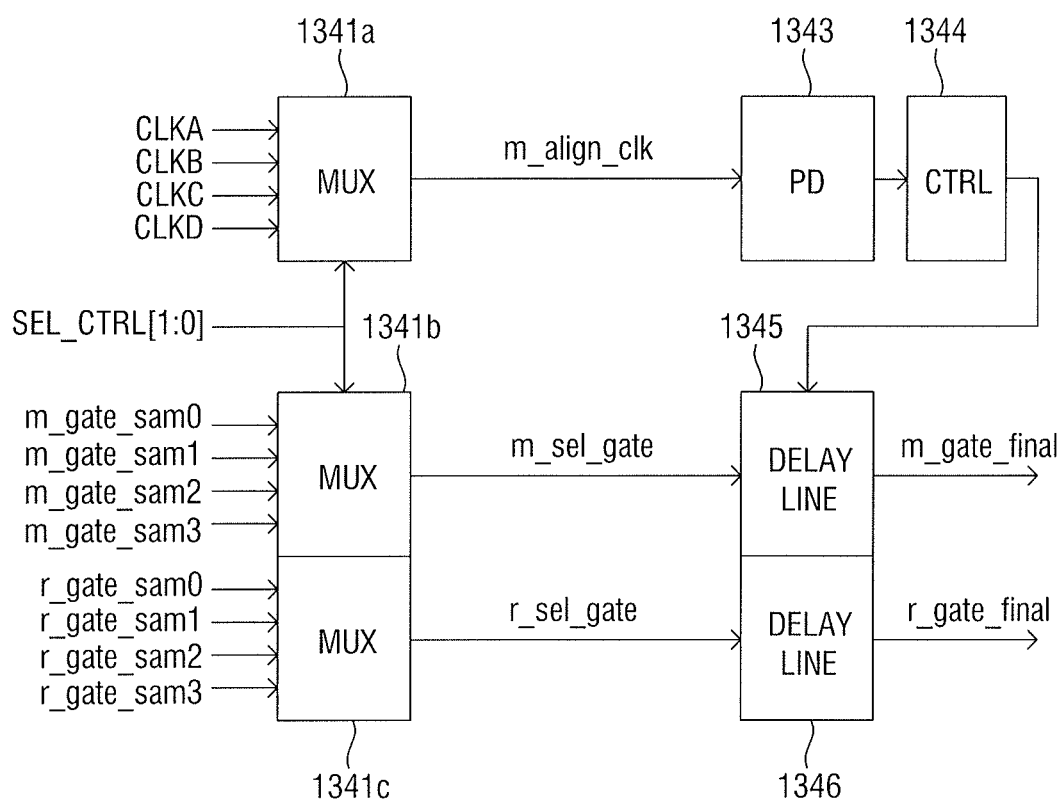
FIGS. 8 and 9 illustrate an example of an operation of a signal locker of the gating clock signal generator in FIG. 6.
Figure 9:
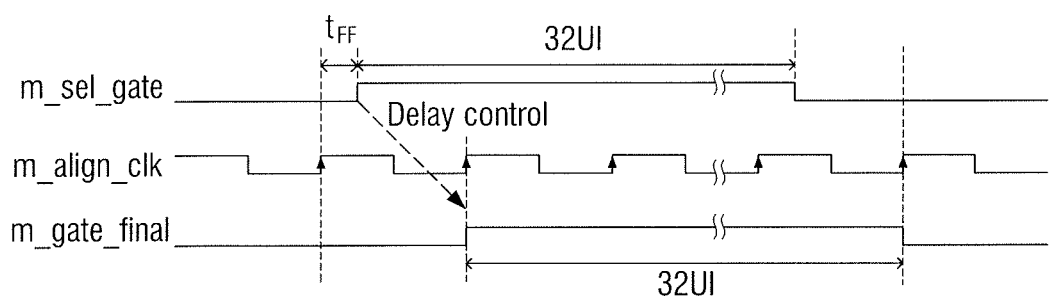

FIGS. 8 and 9 illustrate examples for explaining the operation of the signal locker 134 of the gating clock signal generator 130 in FIG. 6. Referring to FIGS. 8 and 9 together, the signal locker 134 may clock-align the first sampling signals m_gate_sam0 through m_gate_sam3 and the second sampling signals r_gate_sam0 through r_gate_sam3 with the "CLKA," "CLKB," "CLKC," and "CLKD" signals.

For example, the signal locker 134 may align the sampling signal m_gate_sam0 sampled by the "CLKA" signal in FIG. 7 with a rising edge of the "CLKA" signal. Further, the signal locker 134 may include a phase detection circuit 1343, a delay control circuit 1344, and delay lines 1345 and 1346. The phase detection circuit 1343 may detect a phase of a clock signal, e.g., the "CLKA" signal selected by a multiplexer 1341a. The delay control circuit 1344 may align a sampling signal, e.g., m_gate_sam0 selected by a multiplexer 1341b, by controlling the delay line 1345. The realigned signal, e.g., the first gate final signal m_gate_final may be transmitted to the clock generator 136.

Further, the signal locker 134 may align the sampling signal r_gate_sam0 sampled by, e.g., the "CLKA" signal with the rising edge of the "CLKA" signal. For example, the phase detection circuit 1343 may detect a phase of a clock signal, e.g., the "CLKA" signal selected by the multiplexer 1341a. The delay control circuit 1344 may align a sampling signal, e.g., r_gate_sam0 selected by a multiplexer 1341c, by controlling the delay line 1346. The realigned signal, e.g., the second gate final signal r_gate_final, may be transmitted to the clock generator 136.

Figure 10:
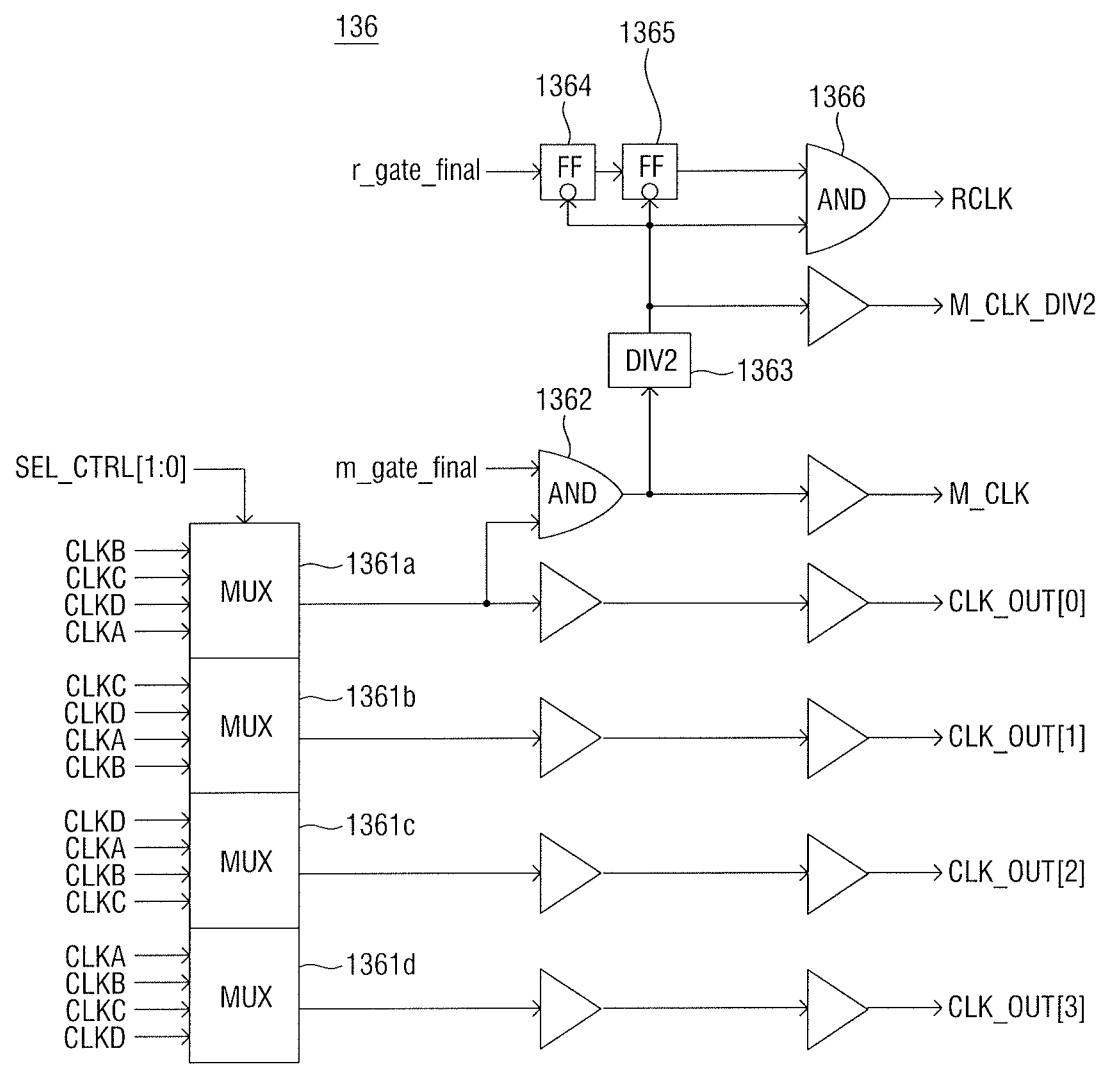
FIG. 10 illustrates an example of an operation of a clock generator of the gating clock signal generator in FIG. 6.

FIG. 10 illustrates an example for explaining the operation of the clock generator 136 of the gating clock signal generator 130 in FIG. 6. Referring to FIG. 10, as the first gate final signal m_gate_final is aligned with the "CLKA" signal, it may be completely gated to the "CLKB" signal. Further, a third clock signal CLK_OUT[0] may be generated based on the "CLKB" signal, and a third clock signal CLK_OUT[1], a third clock signal CLK_OUT[2] and a third clock signal CLK_OUT[3] may be sequentially generated based on the "CLKC," "CLKD" and "CLKA" signals, respectively.

For example, the clock generator 136 may generate the first gating clock signal M_CLK by performing, e.g., an AND logic operation on a clock signal selected by a multiplexer 1361a and the first gate final signal m_gate_final by a logic operation circuit 1362. Further, the clock generator 136 may generate the second gating clock signal M_CLK_DIV2 by diving the first gating clock signal M_CLK using a dividing circuit 1363. For example, the second gating clock signal M_CLK_DIV2 may have a half clock frequency of the first gating clock signal M_CLK.

Further, the clock generator 136 may control flip-flop circuits 1364 and 1365 that deliver the second gate final signal r_gate_final based on the second gating clock signal M_CLK_DIV2 and may perform, e.g., an AND logic operation based on the second gating clock signal M_CLK_DIV2 and a logic operation circuit 1366, thereby generating the third gating clock signal RCLK including only two toggle signals.

Figure 11:
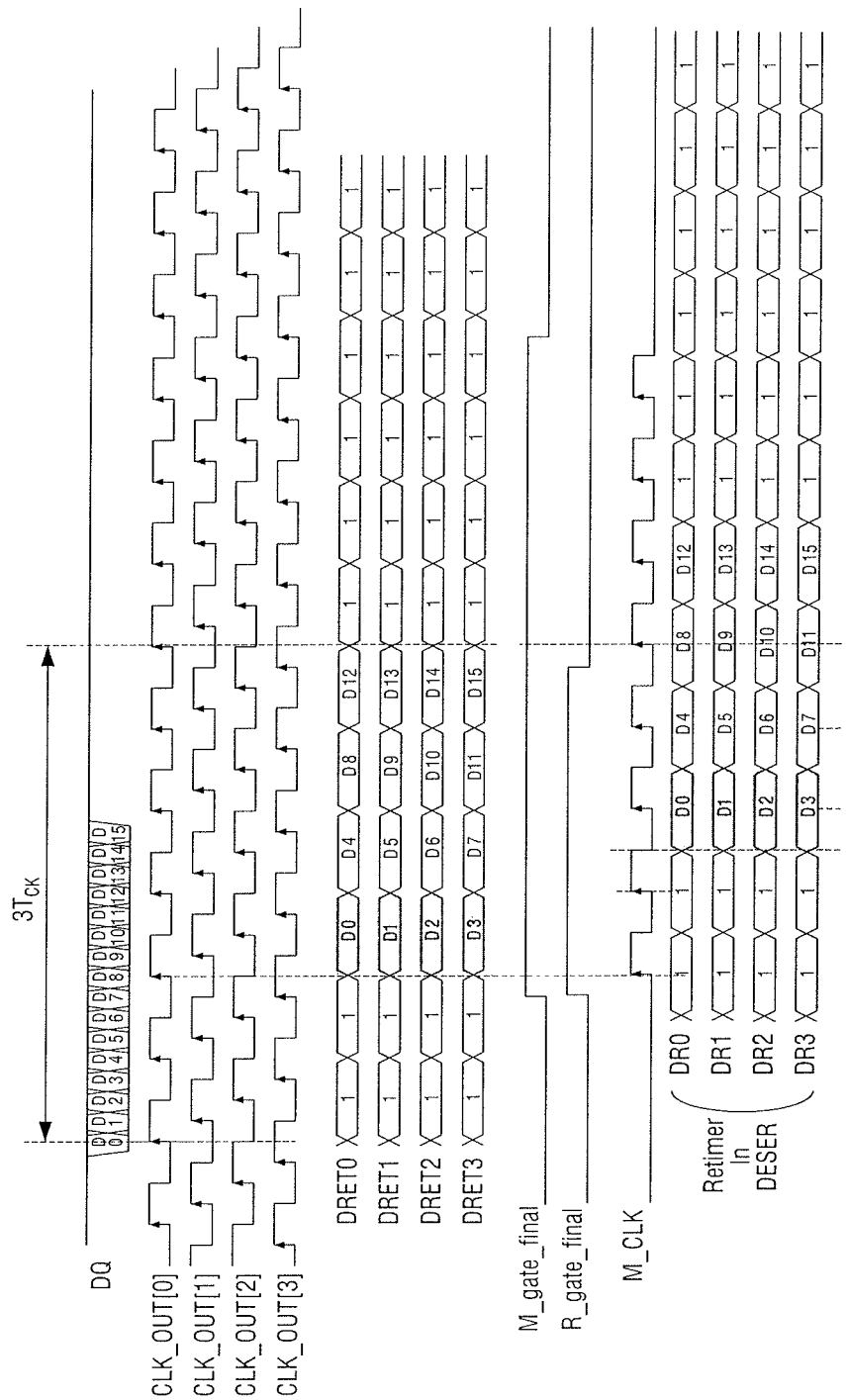
FIGS. 11 through 13 illustrate examples of operations of the semiconductor device.
Figure 12:
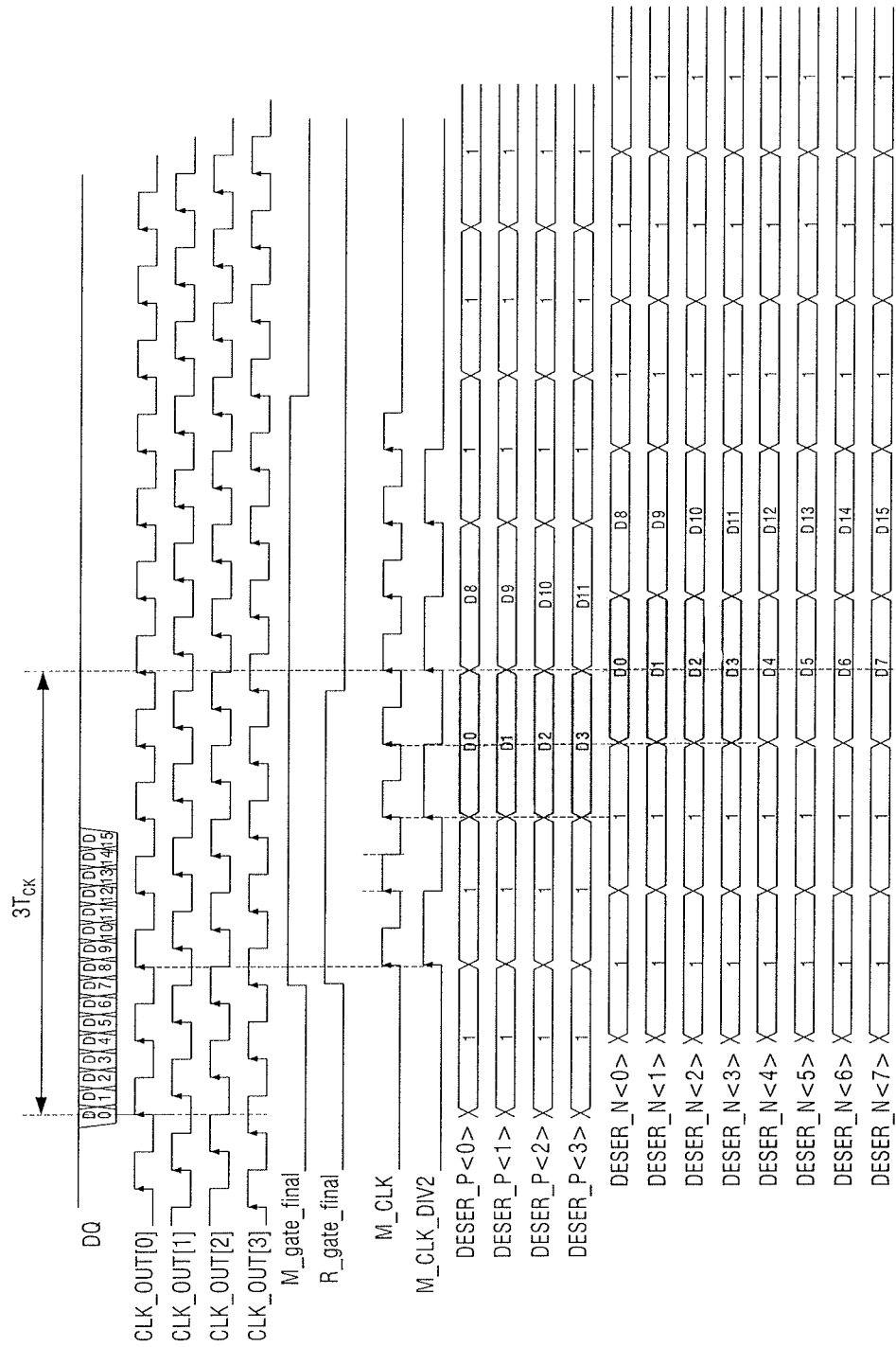
Figure 13:
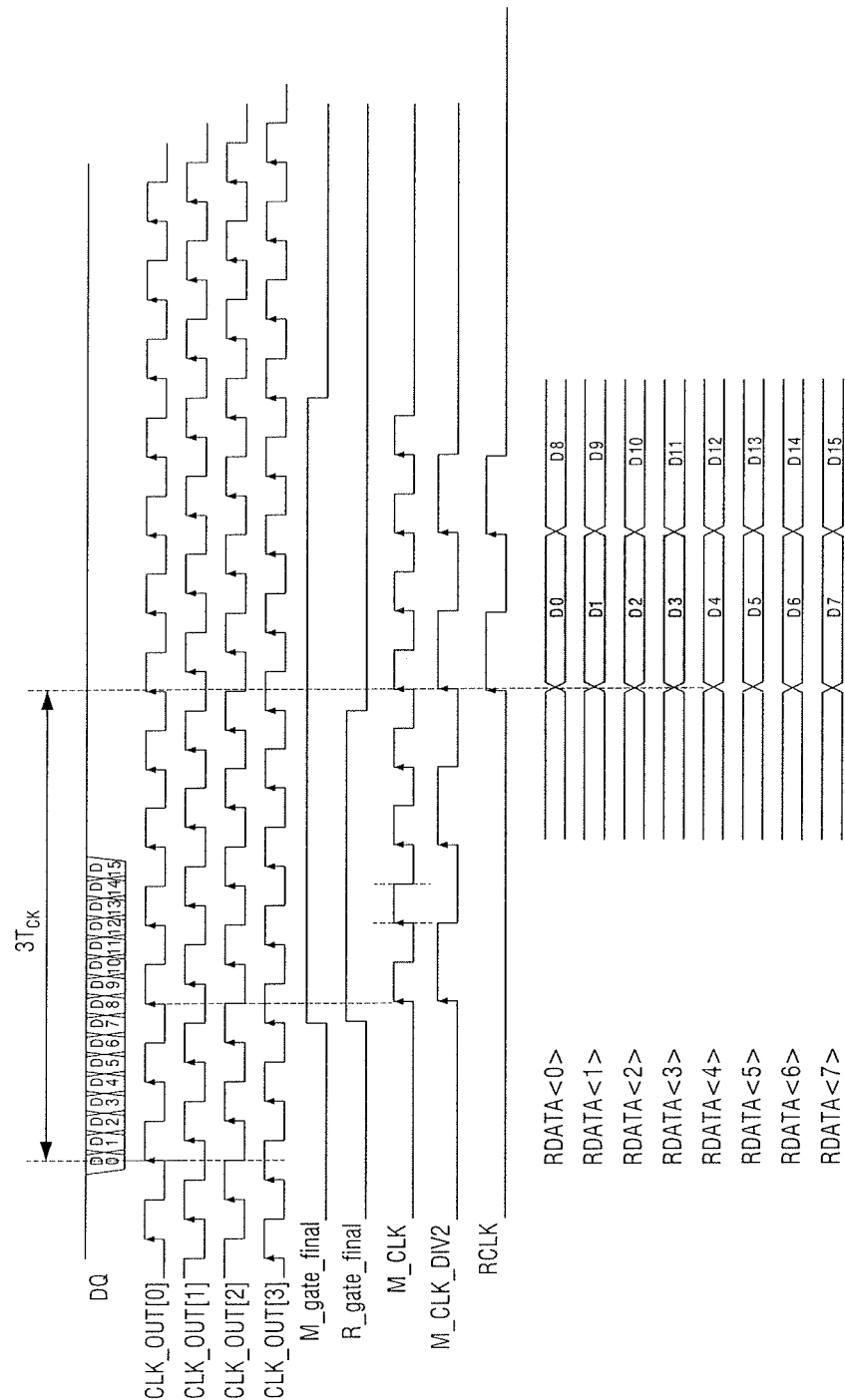

FIGS. 11 through 13 illustrate examples for explaining the operation of the semiconductor device according to an example embodiment. Referring to FIG. 11, sixteen input data signals DQ may be sampled by the third clock signals CLK_OUT[3:0] and output as the first intermediate sampling signals DRET[3:0]. The second intermediate sampling signals DR[3:0] may be output based on the first gate final signal m_gate_final and the second gate final signal r_gate_final generated as described above.

Further, referring to FIG. 12, the third intermediate sampling signals DESER_P<0> through DESER_P<3> and the fourth intermediate sampling signals DESER_N<0> through DESER_N<7> may be output based on the first gating clock signal M_CLK and the second gating clock signal M_CLK_DIV2 generated as described above. Referring to FIG. 13, the parallel data signals RDATA[7:0] may be finally output based on the third gating clock signal RCLK generated as described above.

Figure 14:
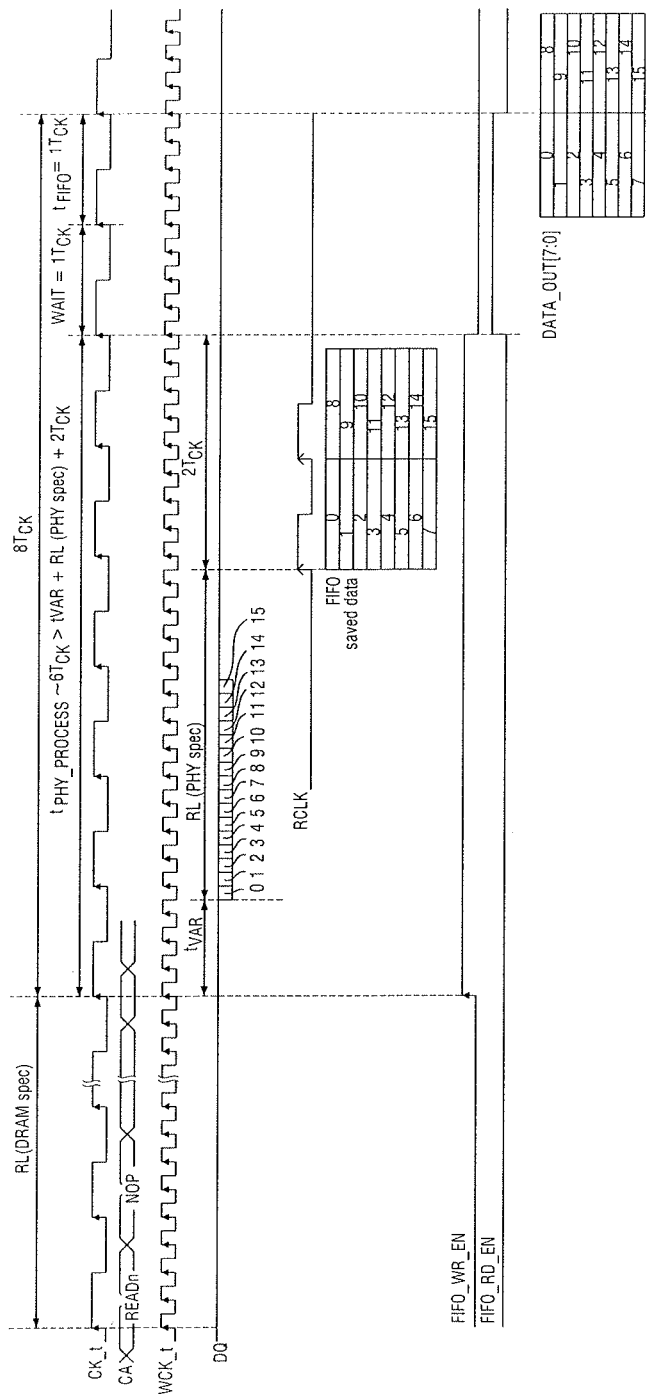
FIG. 14 illustrates an example of an operation of the semiconductor device.
Figure 15:
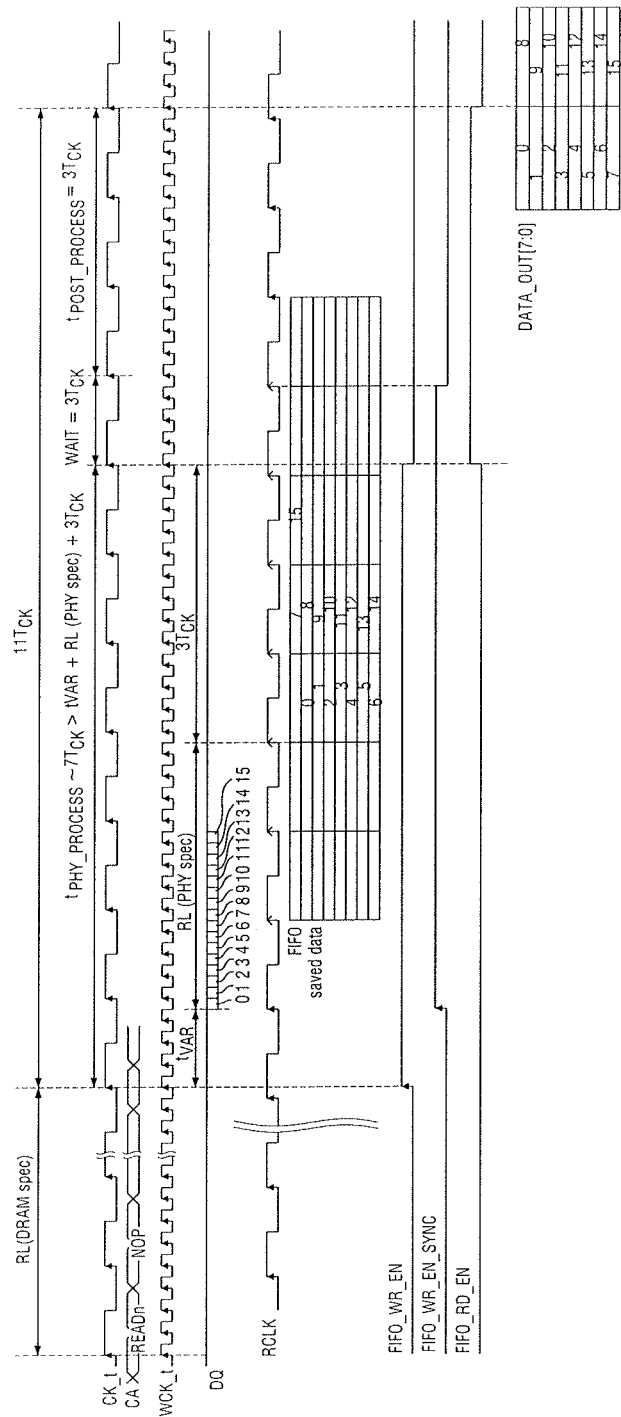
FIG. 15 illustrates a reference example as compared with the operation of the semiconductor device.

FIG. 14 illustrates an example for explaining the operation of the semiconductor device according to an example embodiment. FIG. 15 illustrates an example for explaining a reference example as compared with the operation of the semiconductor device according to the example embodiments.

Referring to FIG. 14, the parallel data signals RDATA[7:0] finally output in FIG. 13 may be stored in the FIFO structure 152. The parallel data signals RDATA[7:0] stored in the FIFO structure 152 may be output as the restored data DATA_OUT[7:0]. Compared with the operation of the reference example in FIG. 15, the semiconductor device, the semiconductor system and the method of operating the semiconductor device according to the example embodiments may reduce an operation time by about $3T_{CK}$, may minimize the size of the FIFO structure 152, and may not require additional operations.

In concluding the detailed description, those skilled in the art will appreciate that many variations and modifications may be made to the preferred embodiments without substantially departing from the principles of the present inventive concept. Therefore, the disclosed preferred embodiments of the inventive concept are used in a generic and descriptive sense only and not for purposes of limitation.

Various operations of methods described above may be performed as is suitable, such as by various hardware and/or software components, modules, and/or circuits. When implemented in software, the operations may be implemented using, for example, an ordered listing of executable instructions for implementing logical functions, and may be embodied in a processor-readable medium for use by or in connection with an instruction execution system, apparatus, or device, such as a single or multiple-core processor or processor-containing system.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium. A software module may reside in, for example, Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other suitable form of storage medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A semiconductor device comprising:
   a gate signal generator to receive a first clock signal and to generate a first gate signal and a second gate signal based on the first clock signal;
   a gating clock signal generator to receive a second clock signal and to generate a first gating clock signal, a second gating clock signal and a third gating clock signal based on the first and second gate signals from the gate signal generator and the second clock signal;
   a data sampler to receive a third clock signal from the gating clock signal generator and to sample an input serial data signal based on the third clock signal to generate a sampled signal; and
   a deserializer to generate a parallel data signal by deserializing the sampled signal based on at least one of the first, second, and third gating clock signals from the gating clock signal generator.

2. The semiconductor device as claimed in claim 1, wherein the gating clock signal generator includes:
   a gating clock synchronizer to generate a plurality of first sampling signals and a plurality of second sampling signals based on the first and second gate signals from the gate signal generator;
   a signal locker to generate a first gate final signal and a second gate final signal by clock-aligning any one of the first sampling signals and any one of the second sampling signals; and
   a clock generator to generate the first gating clock signal, the second gating clock signal and the third gating clock signal based on the first gate final signal and the second gate final signal.

3. The semiconductor device as claimed in claim 2, wherein the gating clock synchronizer generates the first sampling signals by sampling the first gate signal based on the second clock signal.

4. The semiconductor device as claimed in claim 2, wherein the gating clock synchronizer generates the second sampling signals by sampling the second gate signal based on the second clock signal.

5. The semiconductor device as claimed in claim 2, wherein the signal locker clock-aligns any one of the first sampling signals and any one of the second sampling signals to a fourth clock signal derived from the second clock signal.

6. The semiconductor device as claimed in claim 5, wherein the clock generator generates the first gating clock signal, the second gating clock signal and the third gating clock signal by clock-aligning the first gate final signal and the second gate final signal based on the fourth clock signal.

7. The semiconductor device as claimed in claim 5, wherein the clock generator of the gating clock signal generator generates the third clock signal based on the fourth clock signal.

8. The semiconductor device as claimed in claim 1, wherein:
the gate signal generator generates a selection signal and provides the selection signal to the gating clock signal generator, and
the gating clock signal generator selects some of a plurality of internal signals of the gating clock signal generator based on the selection signal received from the gate signal generator.

9. The semiconductor device as claimed in claim 1, further comprising a first-in first-out (FIFO) structure to store the parallel data signal according to the third gating clock signal.

10. The semiconductor device as claimed in claim 9, wherein the third gating clock signal includes only two toggle signals.

11. A semiconductor system comprising:
a graphics double data rate dynamic random access memory (GDDR DRAM); and
a PHY circuit including a first PHY circuit to receive an input serial data signal from the GDDR DRAM, a second PHY circuit to transmit a command and an address to the GDDR DRAM, and a controller to control the first PHY circuit and the second PHY circuit,
wherein the first PHY circuit includes:
a gate signal generator to receives a first clock signal and to generate a first gate signal and a second gate signal based on the first clock signal;
a gating clock signal generator to receive a second clock signal and to generate a first gating clock signal, a second gating clock signal and a third gating clock signal based on the first gate signal and the second gate signal received from the gate signal generator and the second clock signal;
a data sampler to receive a third clock signal from the gating clock signal generator and to sample the input serial data signal using the third clock signal to generate a sampled signal; and
a deserializer to generate a parallel data signal by deserializing the sampled signal based on at least one of the first gating clock signal, the second gating clock signal and the third gating clock signal received from the gating clock signal generator.

12. The semiconductor system as claimed in claim 11, wherein the gating clock signal generator includes:
a gating clock synchronizer to generate a plurality of first sampling signals and a plurality of second sampling signals based on the first gate signal and the second gate signal from the gate signal generator;
a signal locker to generate a first gate final signal and a second gate final signal by clock-aligning any one of the first sampling signals and any one of the second sampling signals; and
a clock generator to generate the first gating clock signal, the second gating clock signal and the third gating clock signal based on the first gate final signal and the second gate final signal.

13. The semiconductor system as claimed in claim 12, wherein the gating clock synchronizer generates the first sampling signals by sampling the first gate signal based on the second clock signal.

14. The semiconductor system as claimed in claim 12, wherein the gating clock synchronizer generates the second sampling signals by sampling the second gate signal based on the second clock signal.

15. The semiconductor system as claimed in claim 12, wherein the signal locker clock-aligns any one of the first sampling signals and any one of the second sampling signals to a fourth clock signal derived from the second clock signal.

16. The semiconductor system as claimed in claim 15, wherein the clock generator generates the first gating clock signal, the second gating clock signal and the third gating clock signal by clock-aligning the first gate final signal and the second gate final signal based on the fourth clock signal.

17. The semiconductor system as claimed in claim 15, wherein the clock generator generates the third clock signal based on the fourth clock signal.

18. The semiconductor system as claimed in claim 11, wherein:
the gate signal generator generates a selection signal and provides the selection signal to the gating clock signal generator, and
the gating clock signal generator selects some of a plurality of internal signals of the gating clock signal generator based on the selection signal received from the gate signal generator.

19. The semiconductor system as claimed in claim 11, further comprising a FIFO structure to store the parallel data signal according to the third gating clock signal.

20. The semiconductor system as claimed in claim 19, wherein the third gating clock signal includes only two toggle signals.

* * * * *